United States Patent
Shimura (10) Patent No.: US 9,190,142 B2
(45) Date of Patent: Nov. 17, 2015

(54) SEMICONDUCTOR MEMORY DEVICE AND METHOD OF CONTROLLING THE SAME

(71) Applicant: Kabushiki Kaisha Toshiba, Minato-ku (JP)

(72) Inventor: Yasuhiro Shimura, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/294,324

(22) Filed: Jun. 3, 2014

(65) Prior Publication Data

US 2015/0262656 A1    Sep. 17, 2015

Related U.S. Application Data (60) Provisional application No. 61/951,952, filed on Mar. 12, 2014.

(51) Int. Cl.
| | |
|---|---|
| G11C 16/10 | (2006.01) |
| G11C 16/04 | (2006.01) |
| G11C 16/34 | (2006.01) |
| G11C 16/12 | (2006.01) |
| G11C 11/56 | (2006.01) |

(52) U.S. Cl.
CPC ........ *G11C 11/5628* (2013.01); *G11C 16/3459* (2013.01); *G11C 16/0483* (2013.01); *G11C 16/10* (2013.01); *G11C 16/3404* (2013.01); *G11C 16/349* (2013.01)

(58) Field of Classification Search
CPC ........... G11C 16/3459; G11C 16/0483; G11C 16/10; G11C 16/3404; G11C 11/5628; G11C 16/349

USPC ............. 365/185.03, 185.17, 185.22, 185.24, 365/185.28
See application file for complete search history.

(56) References Cited

U.S. PATENT DOCUMENTS

| | | | |
|---|---|---|---|
| 6,744,670 B2 | 6/2004 | Tamada et al. | |
| 6,839,276 B2 | 1/2005 | Sugiura et al. | |
| 6,944,063 B2 | 9/2005 | Chen et al. | |
| 7,196,933 B2 | 3/2007 | Shibata | |
| 7,986,560 B2 * | 7/2011 | Park et al. ................. | 365/185.22 |
| 8,446,777 B2 | 5/2013 | Ueno et al. | |
| 8,553,467 B2 * | 10/2013 | Shimura et al. .......... | 365/185.29 |
| 2007/0253256 A1 * | 11/2007 | Aritome .................... | 365/185.24 |
| 2011/0013460 A1 * | 1/2011 | Dong et al. .............. | 365/185.19 |
| 2011/0063917 A1 * | 3/2011 | Shiino et al. ............. | 365/185.17 |
| 2012/0240007 A1 * | 9/2012 | Barndt et al. ................. | 714/758 |
| 2013/0047044 A1 * | 2/2013 | Weathers et al. ............. | 714/708 |

(Continued)

FOREIGN PATENT DOCUMENTS

| | | |
|---|---|---|
| JP | 2003-242787 | 8/2003 |
| JP | 2004-014043 | 1/2004 |

(Continued)

*Primary Examiner* — Ly D Pham
(74) *Attorney, Agent, or Firm* — Oblon, McClelland, Maier & Neustadt, L.L.P.

(57) ABSTRACT

A semiconductor memory device according to an embodiment comprises: a nonvolatile memory cell capable of multi-level storage; and a control circuit that performs write control on the memory cell. The control circuit executes: a first write operation to obtain a certain intermediate voltage distribution; a second write operation to obtain a final voltage distribution; and a change operation that changes a value of the first verify voltage according to the number of times of writes and the number of times of erases on the memory cell.

15 Claims, 6 Drawing Sheets

(56) References Cited

U.S. PATENT DOCUMENTS

| | | | |
|---|---|---|---|
| 2013/0077409 A1* | 3/2013 | Shiino et al. | 365/185.22 |
| 2013/0163342 A1* | 6/2013 | Dutta | 365/185.21 |
| 2013/0227200 A1* | 8/2013 | Cometti et al. | 711/103 |
| 2014/0098615 A1* | 4/2014 | Mu et al. | 365/185.22 |
| 2014/0281820 A1* | 9/2014 | Alrod et al. | 714/773 |

FOREIGN PATENT DOCUMENTS

| | | |
|---|---|---|
| JP | 2006-513525 | 4/2006 |
| JP | 2011-123993 | 6/2011 |
| JP | 2012-226806 | 11/2012 |

\* cited by examiner

SEMICONDUCTOR MEMORY DEVICE AND METHOD OF CONTROLLING THE SAME

CROSS REFERENCE TO RELATED APPLICATIONS

This application is based on and claims the benefit of priority from prior U.S. Provisional Patent Application No. 61/951,952, filed on Mar. 12, 2014, the entire contents of which are incorporated herein by reference.

BACKGROUND

Field

Embodiments described in the present specification relate to a semiconductor memory device and a method of controlling the same.

In a nonvolatile semiconductor memory device such as a NAND type flash memory, a memory cell includes a control gate and a charge accumulation layer, and stores as data a magnitude of a threshold voltage of the memory cell that changes according to a charge accumulated in the charge accumulation layer. It is known that by setting a plurality of threshold voltages in the memory cell of the above-described semiconductor memory device, the semiconductor memory device is made capable of multi-level storage.

DETAILED DESCRIPTION

A semiconductor memory device according to an embodiment comprises: a nonvolatile memory cell capable of multi-level storage; and a control circuit that performs write control on the memory cell. The control circuit executes: a first write operation that performs a write on the memory cell to obtain a certain intermediate voltage distribution while performing a verify operation on the memory cell using a first verify voltage; a second write operation, executed after the first write operation, that performs a write on the memory cell having the intermediate voltage distribution to obtain a final voltage distribution corresponding to write data to the memory cell while performing a verify operation on the memory cell using a second verify voltage; and a change operation that changes a value of the first verify voltage according to the number of times of writes and the number of times of erases on the memory cell.

Embodiments will be described in detail below with reference to the drawings.

First Embodiment

Figure 1:
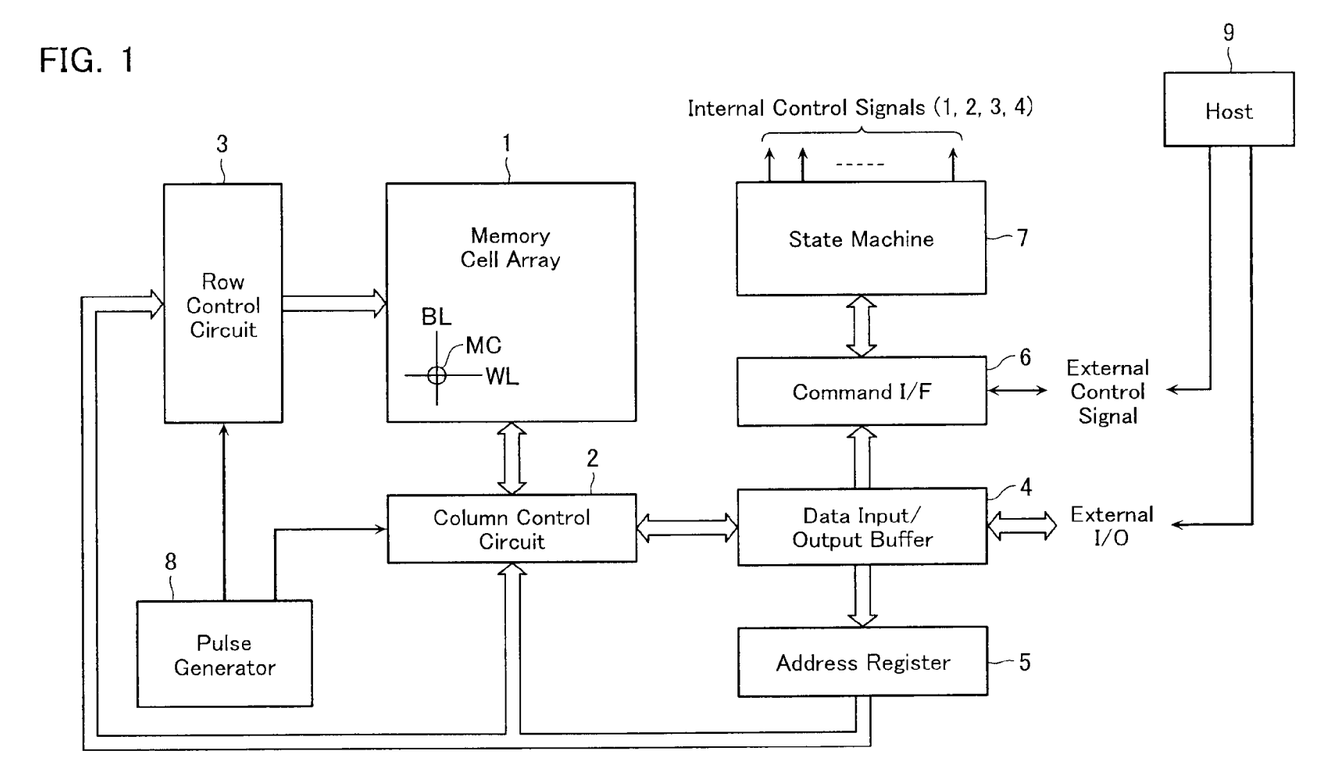
FIG. 1 is an overall block diagram of a semiconductor memory device according to a first embodiment.

First, a first embodiment will be described with reference to FIGS. 1 to 6. FIG. 1 is a block diagram showing a configuration of a nonvolatile semiconductor memory device according to the first embodiment. The present semiconductor memory device is a NAND type flash memory adopting a four-level storage system. The present semiconductor memory device comprises a memory cell array 1 having a plurality of data-storing memory cells MC disposed in a matrix therein. The memory cell array 1 includes a plurality of bit lines BL and a plurality of word lines WL that intersect each other, and has the memory cell MC disposed at each of intersections of said bit lines BL and word lines WL. The memory cell MC has a stacked structure of a floating gate electrode which functions as a charge accumulation layer that accumulates a charge, and a control gate electrode which is connected to the word line WL. The memory cell MC is configured capable of electrically rewriting data by injection or release of charge into/from the floating gate electrode.

Connected to the memory cell array 1 are a column control circuit 2 for controlling a voltage of the bit line BL, and a row control circuit 3 for controlling a voltage of the word line WL. The column control circuit 2 reads data from the memory cell MC via the bit line BL and performs write of data to the memory cell MC via the bit line BL. The row control circuit 3 applies a voltage for write, read, and erase of data, to a gate electrode of the memory cell MC, via the word line WL.

Connected to the column control circuit 2 is a data input/output buffer 4. Data of the memory cell MC read by the column control circuit 2 is outputted to an external host 9 from a data input/output terminal (external I/O) via the data input/output buffer 4. Moreover, write data inputted to the data input/output terminal (external I/O) from the external host 9 is inputted to the column control circuit 2 via the data input/output buffer 4, and is written to a designated memory cell MC.

Connected to the data input/output buffer 4 are an address register 5 and a command I/F 6. The address register 5 outputs address information inputted from the data input/output buffer 4, to the column control circuit 2 and the row control circuit 3. The command I/F 6 is connected to a state machine 7 and the external host 9, and sends/receives a control signal between these blocks. Connected to the state machine 7 are the memory cell array 1, the column control circuit 2, the row control circuit 3, and the data input/output buffer 4. The state machine 7 generates an internal control signal for controlling the memory cell array 1, the column control circuit 2, the row control circuit 3, and the data input/output buffer 4, based on an external control signal inputted from the host 9 via the command I/F 6. The above-described various kinds of circuits including the column control circuit 2 and the row control circuit 3 function as a control circuit that controls a data write operation during data write to the later-described memory cell MC.

Figure 2:
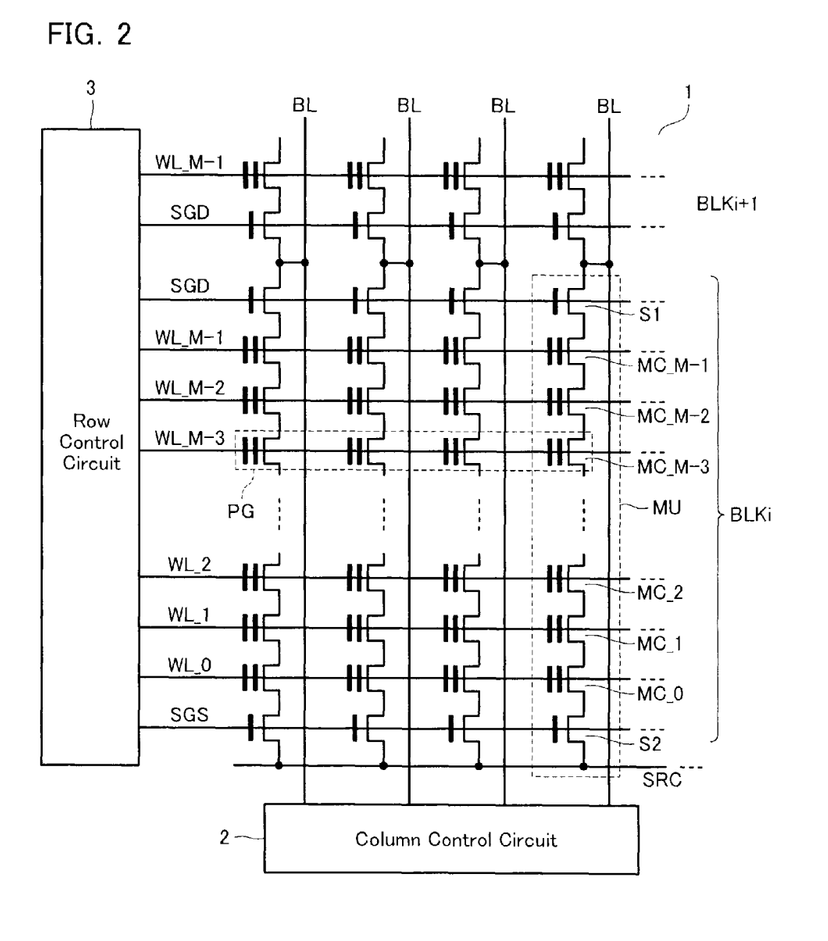
FIG. 2 is a circuit diagram showing a detailed configuration of a memory cell array.

FIG. 2 is a circuit diagram showing a configuration of a part of the memory cell array 1 shown in FIG. 1. The memory cell array 1 includes a plurality of memory units MU. The memory unit MU is configured from M (for example, M=16)

memory cells MC_0 to MC_M−1 connected in series, and a first select gate transistor S1 and a second select gate transistor S2 connected to the two ends of these series-connected memory cells MC_0 to MC_M−1. One end of the first select gate transistor S1 is connected to the bit line BL, and one end of the second select gate transistor S2 is connected to a source line SRC. That is, the memory cells MC are arranged in series sandwiched by a plurality of select transistors (S1 and S2), at a region of intersection of the word line WL and the bit line BL.

Word lines WL_0 to WL_M−1 are connected to the control gate electrodes of the memory cells MC_0 to MC_M−1. The plurality of memory units MU are disposed in a direction of formation of the word line WL, and form one block BLKi. In the memory cell array 1, erase of data is performed in a block BLK unit. Moreover, the plurality of memory cells MC commonly connected to one word line WL (reference symbol PG) forms one page or a plurality of pages. In the memory cell array 1, write and read of data is performed simultaneously on the memory cells along one word line.

Figure 3:
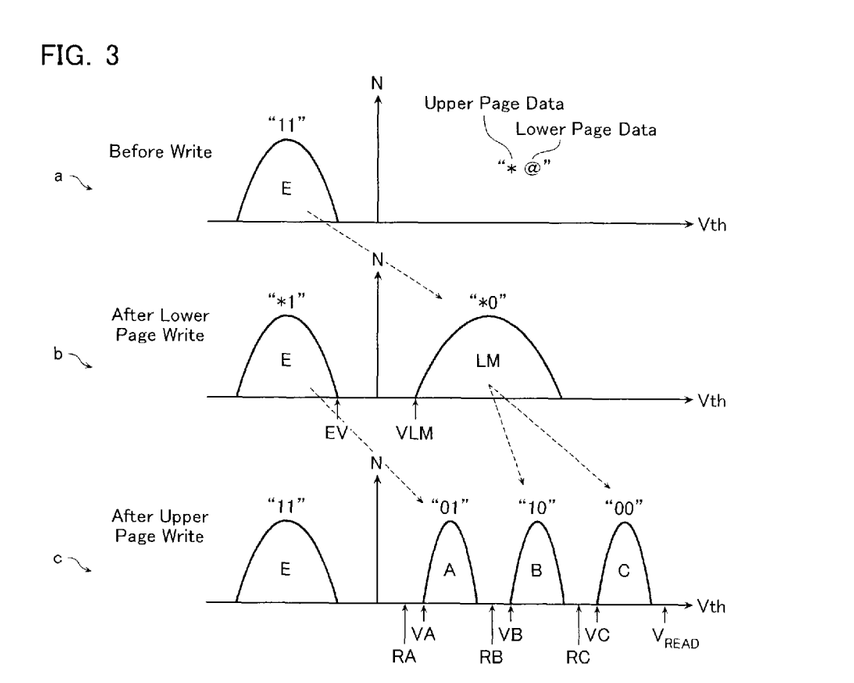
FIG. 3 includes schematic views showing threshold voltages of a memory cell during data write.

Next, an outline of a data storage system of the nonvolatile semiconductor memory device will be described. The nonvolatile semi conductor memory device is configured such that a threshold voltage of the memory cell MC can have four kinds of distributions. FIG. 3, in a to c thereof, includes views showing a relationship between change in a threshold voltage distribution of the memory cell MC and two-bit four-level data stored in the memory cell MC during data write of the nonvolatile semiconductor memory device. The four-level data are specified by, for example, a negative threshold voltage distribution (erase distribution) E having a lowest level of voltage level, and threshold voltage distributions A, B, and C having higher voltage levels than that of the threshold voltage distribution E. In the present embodiment, the threshold voltage distributions E, A, B, and C are assumed to correspond to data "11", "01", "10", and "00", respectively.

First, as shown in a of FIG. 3, before write, the memory cells included in the write-target block (refer to BLKi of FIG. 2) are all set to the erase state threshold voltage distribution (E) by data erase. This data erase is performed by, for example, applying a positive erase voltage (Vera, not illustrated in FIG. 3) to a well where the memory cell array 1 is formed, and setting a potential of all word lines WL of the selected block to 0 V, thereby releasing electrons from the floating gates of all memory cells MC.

Next, as shown in b of FIG. 3, some of the memory cells MC in the erase state (E) undergo a lower page write (Lower Page Program) that raises their threshold voltage to an intermediate voltage distribution (LM). Then, a verify operation for verifying completion of the lower page write is performed by setting a verify voltage to a voltage VLM and applying said voltage between the gate and the source of the memory cell MC. If the memory cell MC conducts due to the verify voltage VLM, then write fail (FAIL) is determined, and if the memory cell MC does not conduct due to the verify voltage VLM, then write pass (PASS) is determined. As a result, the threshold voltage of the memory cell MC that has undergone the lower page write rises and undergoes transition to the intermediate threshold voltage distribution (LM).

Next, as shown in c of FIG. 3, an upper page write (Upper Page Program) is performed that raises some of the memory cells MC in the erase state (E) to the threshold voltage distribution A and raises the memory cell MC in the intermediate voltage distribution (LM) to the threshold voltage distribution B or C. Then, similarly to in the case of the lower page write, a verify operation for verifying completion of the upper page write is performed by setting a verify voltage to, respectively, VA, VB, and VC and applying said voltage between the gate and the source of the memory cell MC. As a result, the threshold voltage of the memory cell MC that has undergone the upper page write rises and undergoes transition to any one of the threshold voltage distributions A, B, and C.

In the above data write operation, the selected word line to which one page of write-target memory cells MC are connected is provided with a write voltage VPGM (about 20 to 28 V), and another non-selected word line is provided with a write pass voltage Vpass (about 8 to 10 V). On that basis, depending on write data, the bit line electrically connected to the write-target memory cell MC is selectively provided with a ground voltage Vss (in the case of "0" write) and a power supply voltage VDD (in the case of "1" write). As a result, electrons are selectively injected into the floating gate of the memory cell MC.

In the case of "0" write that raises the threshold voltage, the ground voltage Vss provided to the bit line is transmitted to a channel of the NAND cell unit via the first select gate transistor S1 set to a conductive state. As a result, when the write voltage VPGM is provided, a tunnel current flows between the channel and the floating gate, and electrons are injected into the floating gate.

On the other hand, in the case of "1" write that does not raise the threshold voltage (write inhibit), the bit line is provided with the power supply voltage VDD. In this state, even if the power supply voltage VDD is provided to the first select gate transistor S1, the channel of the NAND cell unit is charged to VDD-Vt (Vt is the threshold voltage of the first select gate transistor S1) to be in a floating state. As a result, when the write voltage VPGM is provided, the cell channel is boosted by capacitive coupling, and electron injection into the floating gate does not occur.

During read of data, read voltages RA, RB, and RC which are voltages between upper limits and lower limits of each of the threshold voltage distributions E to C are applied between the gate and the source of the read-target selected memory cell MC. Moreover, a read pass voltage $V_{READ}$ (refer to c of FIG. 3) which is larger than the upper limit of the threshold voltage distribution C is applied between the gate and the source of a non-read-target non-selected memory cell MC. The read pass voltage $V_{READ}$ is a voltage that has a value larger than that of the upper limit of the threshold voltage distribution C and that enables the memory cell MC to be set to a conductive state irrespective of held data of the memory cell MC.

As described above, the threshold voltage distribution of the write-completed memory cell MC eventually becomes any one of E, A, B, and C (refer to c of FIG. 3). As previously mentioned, these threshold voltage distributions correspond to data "11 (E)", "01 (A)", "10 (B)", and "00 (C)", respectively. That is, two-bit data of one memory cell MC is configured from lower page data and upper page data, and when notated as data "*@", "*" represents the upper page data, and "@" represents the lower page data.

Figure 4:
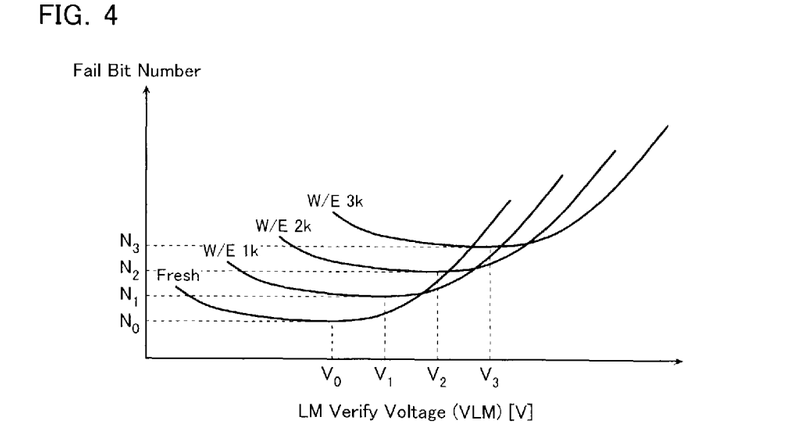
FIG. 4 is a graph showing a relationship between a verify voltage VLM in a lower page write and a fail bit number which is the number of memory cells that have failed in write.

FIG. 4 is a graph showing a relationship between the verify voltage VLM in the lower page write in b of FIG. 3 and a fail bit number which is the number of memory cells that have failed in write. Here, write and erase of data to the memory cell is assumed to be one cycle. FIG. 4 illustrates respective graphs for when 0 cycles have been completed (Fresh), when 1000 cycles have been completed (W/E 1 k), when 2000 cycles have been completed (W/E 2 k), and when 3000 cycles have been completed (W/E 3 k).

As shown in FIG. 4, each of the graphs has a downwardly directed convex shape, hence an optimum verify voltage at which the fail bit number becomes a minimum can be calculated based on said graphs. For example, when 0 cycles have been completed, the optimum verify voltage is VLM=$V_0$. Similarly, the optimum voltages when 1000 cycles have been completed, when 2000 cycles have been completed, and when 3000 cycles have been completed are VLM=$V_1$, VLM=$V_2$, and VLM=$V_3$, respectively. A magnitude relationship of each of the verify voltages is $V_0<V_1<V_2<V_3$.

The reason that the optimum verify voltage changes as in FIG. 4 is thought to be because as the number of times of writes and erases to the memory cell increases, it becomes easier for the threshold voltage of the memory cell to lower during data hold, and it becomes easier for write fail to occur. Such a phenomenon becomes a problem particularly when forming the intermediate voltage distribution (VLM) on the way to a final voltage distribution corresponding to write data. For example, in such cases as when a power source supply to the semiconductor memory device gets interrupted during the course of data write, the need arises to maintain the intermediate voltage distribution until re-start of write. In view of the above, continuing to employ a uniform verify voltage regardless of a value of the write cycle results in the fail bit number being increased in the lower page write for forming the intermediate voltage distribution, and is undesirable.

Figure 5:
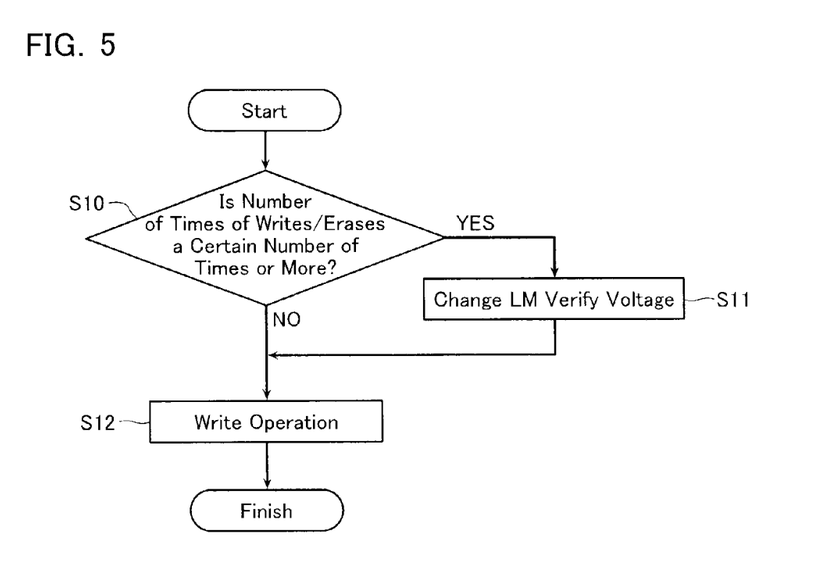
FIG. 5 is a flowchart showing a data write method of the semiconductor memory device according to the first embodiment.

FIG. 5 is a flowchart showing a data write method of the semiconductor memory device according to the first embodiment. First, the control circuit determines whether a cycle number corresponding to the number of times of writes and the number of times of erases is a certain number of times or more, or not (step S10). Said step may be implemented by, for example, providing in the control circuit a counter that counts the above-described cycle number, and directly counting said cycle number.

If it is determined in step S10 that the number of times of writes and the number of times of erases is a certain value or more (step S10=YES), then the control circuit changes the verify voltage VLM for obtaining the intermediate voltage distribution. Said step may be executed by, for example, obtaining the optimum verify voltage from the write cycle number based on a table (not illustrated) corresponding to the graph of FIG. 4. For example, it is possible to respectively set VLM=V1, VLM=V2, and VLM=V3 when the number of times of writes is 1000 times or more, 2000 times or more, and 3000 times or more. Then, the control circuit executes a data write operation to the memory cell using the changed verify voltage (step S12).

On the other hand, if it is not determined in step S10 that the number of times of writes is the certain value or more (step S10=NO), then the control circuit executes the data write operation using the verify voltage V0 already set, without changing the verify voltage VLM (step S12).

Figure 6:
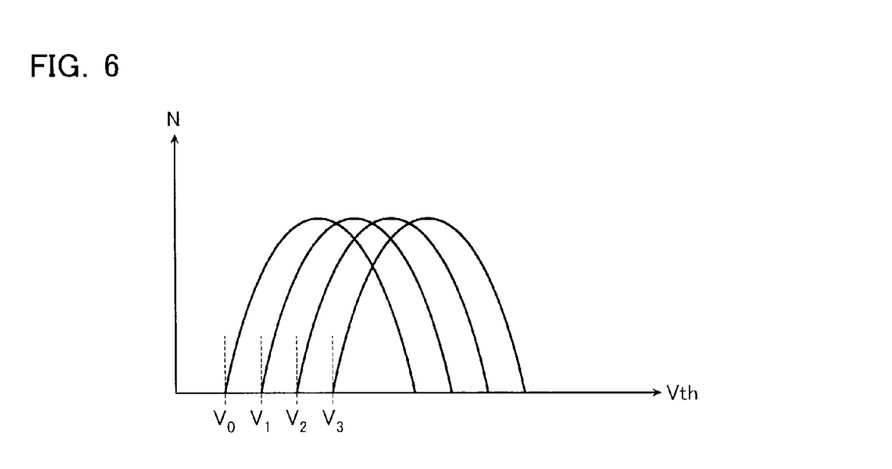
FIG. 6 is a graph showing threshold distributions of the memory cell after data write.

FIG. 6 is a graph showing threshold distributions of the memory cell after data write. As the verify voltage becomes larger, at V0, V1, V2, and V3, a peak of the threshold voltage distribution is also found to shift to a high voltage side. As a result, a margin for data retention expands, hence increase in the fail bit number can be suppressed.

Due to the semiconductor memory device according to the first embodiment, in the write operation for obtaining the intermediate voltage distribution in a process on the way to obtaining the final voltage distribution corresponding to write data, the verify voltage VLM is changed based on the number of times of writes and the number of times of erases. As a result, increase in the fail bit number can be suppressed and hold characteristics of data can be improved.

Note that another possible method of suppressing increase in the fail bit number is to increase a value of the write voltage applied when forming the intermediate voltage distribution LM. However, in said method, sometimes, a width of the threshold voltage distribution gets broadened (refer to FIG. 6), and there is an effect on the subsequent write operation. In contrast, in the case of the write method according to the first embodiment, the verify voltage, not the write voltage, is changed, hence increase in the fail bit number can be suppressed while the width of the threshold voltage distribution is kept narrow.

Second Embodiment

Next, a second embodiment will be described with reference to FIGS. 7 and 8. A semiconductor memory device according to the second embodiment has a configuration and a data storage system that are the same as those of the first embodiment (FIGS. 1 to 3), but has a write operation procedure that differs from that of the first embodiment. Specifically, the second embodiment differs in performing a pre-write and a pre-verify to the memory cell. This will be described in detail below.

Figure 7:
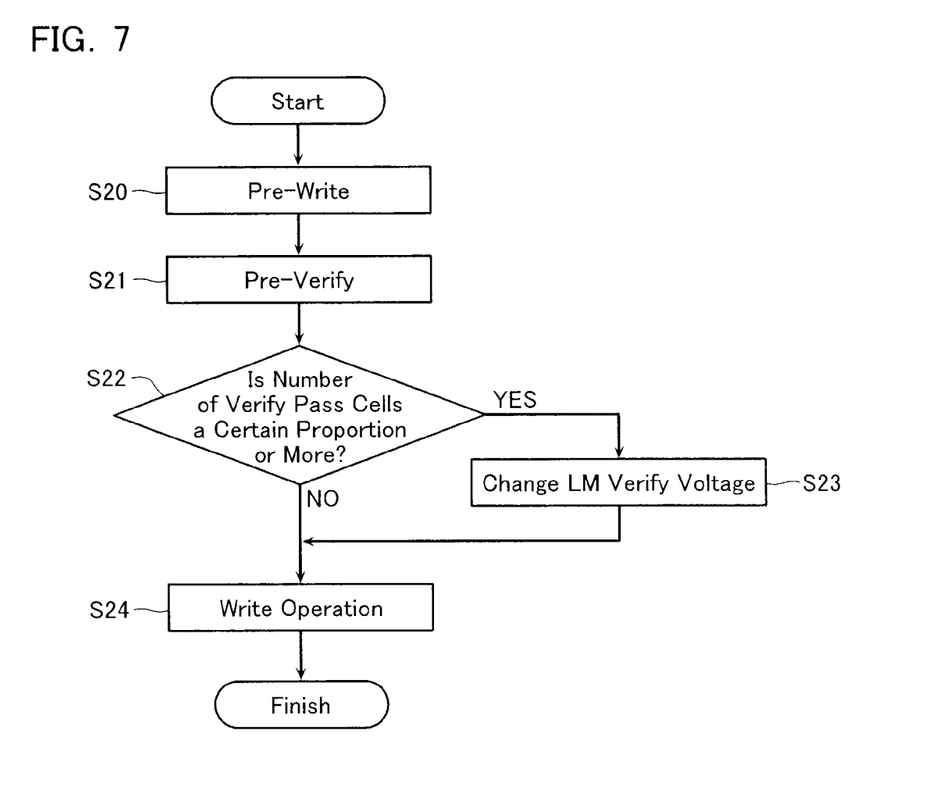
FIG. 7 is a flowchart showing a data write method of a semiconductor memory device according to a second embodiment.

FIG. 7 is a flowchart showing a data write method of the semiconductor memory device according to the second embodiment. First, the control circuit implements the pre-write on the memory cell in the erase state (E) (step S20). A pre-write refers to performing a write on a "0" write-target memory cell using a write voltage which is smaller than a voltage (word line voltage VPGM and bit line voltage VSS) used during an ordinary data write. As a result, the threshold voltage of the memory cell that has undergone the pre-write rises by an amount of a voltage width which is smaller than in the ordinary data write.

Next, the control circuit implements the pre-verify operation on the memory cell that has undergone the pre-write in step S20 (step S21). A pre-verify operation refers to performing a verify using a verify voltage which is lower than the verify voltage VLM during the lower page write. By performing the pre-write and the pre-verify on the write-target memory cell as in steps S20 to S21, the threshold voltage distribution of the memory cell can be caused to undergo transition from the erase state (E) to a high voltage side (LM side). This makes it possible to suppress a shift amount of the threshold voltage distribution of the "0" write-target memory cell during the lower page write. As a result, excessive write to the memory cell can be suppressed.

Next, the control circuit determines whether the number of memory cells that have passed the pre-verify in step S21 is a certain proportion or more, or not (step S22). Now, as the number of times of writes and the number of times of erases to the memory cell increases, the shift amount of the threshold voltage in one time of write increases, and the number of memory cells that pass the pre-verify increases. Accordingly, if the number of memory cells that have passed the pre-verify is a certain proportion or more (step S22=YES), then the control circuit performs change of the verify voltage VLM in the same way as in the first embodiment (step S11 of FIG. 5) (step S23). Then, the control circuit executes the data write operation similarly to in the first embodiment (step S24).

On the other hand, if the number of memory cells that have passed the pre-verify is not a certain proportion or more (step S22=NO), then the control circuit executes the data write operation using the verify voltage already set, without changing the verify voltage (step S24).

Due to the semiconductor memory device according to the second embodiment, change of the verify voltage VLM is performed based on the proportion of memory cells that have passed the pre-verify. Therefore, change of the verify voltage can be performed substantively based on the number of times of writes and the number of times of erases, without directly counting the number of times of writes and the number of times of erases. As a result, increase in the fail bit number can be suppressed and hold characteristics of data can be improved in the same way as in the first embodiment.

Additionally due to the second embodiment, implementing the pre-write and the pre-verify makes it possible to suppress the shift amount of the threshold voltage during the lower page write. As a result, excessive write can be suppressed and yield can be improved in the process of forming the intermediate voltage distribution.

In the first through second embodiments, description proceeded taking as an example a memory cell capable of four-level storage. However, said embodiments can be similarly applied to any multi-level storage memory cell that forms an intermediate voltage distribution during data write. This will be described below.

Figure 8:
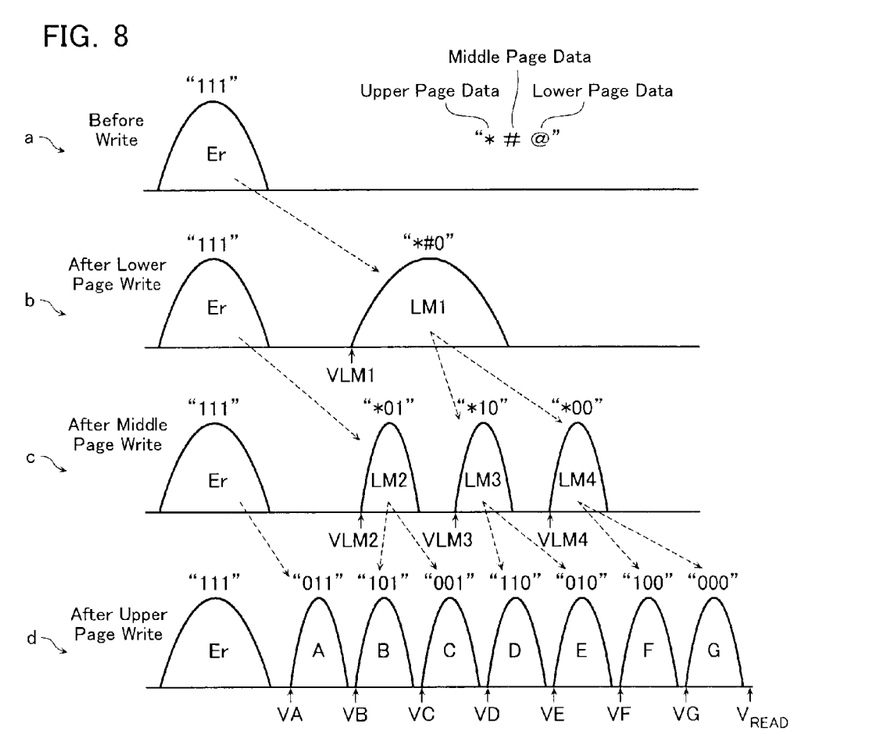
FIG. 8 includes schematic views showing threshold voltages of a memory cell during data write of a semiconductor memory device according to another embodiment.

FIG. 8 includes schematic views showing threshold voltages of a memory cell during data write of a semiconductor memory device according to another embodiment. The semiconductor memory device according to said embodiment is configured such that a threshold voltage of the memory cell MC can have eight kinds of distributions. FIG. 8, in a to d thereof, includes views showing a relationship between change in a threshold voltage distribution of the memory cell MC and three-bit eight-level data stored in the memory cell MC during data write of the nonvolatile semiconductor memory device. The eight-level data are specified by, for example, a negative threshold voltage distribution (erase distribution) Er having a lowest level of voltage level, and threshold voltage distributions A, B, C, D, E, F, and G having higher voltage levels than that of the threshold voltage distribution Er. In the present embodiment, the threshold voltage distributions Er and A to G are assumed to correspond to data in the following way, namely Er="111", A="011", B="101", C="001", D="110", E="010", F="100", and G="000" (refer to d of FIG. 8).

First, as shown in a of FIG. 8, before write, the memory cells included in the write-target block (refer to BLKi of FIG. 2) are all set to the erase state threshold voltage distribution (Er) by data erase. This data erase is performed by, for example, applying a positive erase voltage (Vera, not illustrated in FIG. 8) to a well where the memory cell array 1 is formed, and setting a potential of all word lines WL of the selected block to 0 V, thereby releasing electrons from the floating gates of all memory cells.

Next, as shown in b of FIG. 8, some of the memory cells in the erase state (Er) undergo a lower page write (Lower Page Program) that raises their threshold voltage to an intermediate voltage distribution (LM1). Then, a verify operation for verifying completion of the lower page write is performed by setting a verify voltage to a voltage VLM1 and applying said voltage between the gate and the source of the memory cell. If the memory cell conducts due to the verify voltage VLM1, then write fail (FAIL) is determined, and if the memory cell does not conduct due to the verify voltage VLM1, then write pass (PASS) is determined. As a result, the threshold voltage of the memory cell that has undergone the lower page write rises and undergoes transition to the intermediate threshold voltage distribution (LM1).

Next, as shown in c of FIG. 8, a middle page write (Middle Page Program) is performed that raises some of the memory cells in the erase state (Er) to an intermediate voltage distribution LM2 and causes the memory cell in the threshold voltage distribution LM1 to undergo transition to intermediate voltage distributions LM3 or LM4. Then, similarly to in the case of the lower page write, a verify operation for verifying completion of the middle page write is performed by setting a verify voltage to, respectively, VLM2, VLM3, and VLM4 and applying said voltage between the gate and the source of the memory cell. As a result, the threshold voltage of the memory cell that has undergone the middle page write rises and undergoes transition to any one of the threshold voltage distributions LM2, LM3, and LM4.

Next, as shown in d of FIG. 8, an upper page write (Upper Page Program) is performed that raises some of the memory cells in the erase state (Er) to the threshold voltage distribution A and causes the memory cell in the intermediate voltage distributions LM2 to LM4 to undergo transition to any one of the threshold voltage distributions B to G. More specifically, the threshold voltage distributions B and C are generated from the threshold voltage distribution LM2, the threshold voltage distributions D and E are generated from the threshold voltage distribution LM3, and the threshold voltage distributions F and G are generated from the threshold voltage distribution LM4. Then, a verify operation for verifying completion of the upper page write is performed by setting a verify voltage to, respectively, VA to VG and applying said voltage between the gate and the source of the memory cell. As a result, the threshold voltage of the memory cell that has undergone the upper page write rises and undergoes transition to any one of the threshold voltage distributions A to G.

Similarly to the semiconductor memory devices of the first through second embodiments, the above-described kind of semiconductor memory device also has a problem with hold characteristics of data when forming, for example, the intermediate voltage distribution LM1 in b of FIG. 8 or the intermediate voltage distributions LM2 to LM4 in c of FIG. 8. Accordingly, it is preferable that in the case of one or more of the verify voltages VLM1, VLM2, VLM3, and VLM4 for obtaining the intermediate voltage distributions, a value of the verify voltage is changed according to the number of times of writes and the number of times of erases on the memory cell. As a result, increase in the fail bit number can be suppressed and hold characteristics of data can be improved.

Figure 9A:
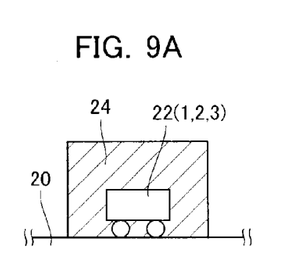
FIGS. 9A to 9B include cross-sectional schematic views each showing a configuration of the semiconductor memory device according to the first through second embodiments.
Figure 9B:
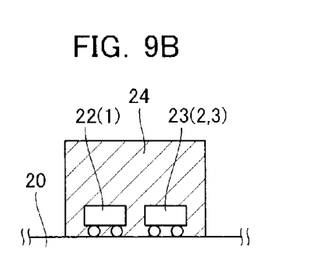

FIGS. 9A and 9B are each a cross-sectional schematic view showing a configuration of the semiconductor memory device according to the first through second embodiments. In FIG. 9A, a semiconductor chip 22 is mounted on a substrate 20, and a sealing resin 24 is formed in a region above the substrate 20 and covering the semiconductor chip 22. In FIG. 9A, the column control circuit 2 and the row control circuit 3 which are an example of the control circuit are formed in the identical semiconductor chip 22 to the memory cell array 1.

In FIG. 9B, semiconductor chips 22 and 23 are mounted on a substrate 20, and a sealing resin 24 is formed in a region above the substrate 20 and covering the semiconductor chips 22 and 23. In FIG. 9B, the memory cell array 1 is formed in the semiconductor chip 22, and the column control circuit 2 and the row control circuit 3 which are an example of the control circuit are formed in the semiconductor chip 23. That is, the column control circuit 2 and the row control circuit 3 which are an example of the control circuit are provided externally to the semiconductor chip 22 where the memory cell array 1 is formed. The semiconductor chips 22 and 23 are electrically connected by wiring not illustrated.

Other Embodiments

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a nonvolatile memory cell capable of multi-level storage; and
   a control circuit that performs write control on the memory cell,
   the control circuit executing:
   a first write operation that performs a write on the memory cell to obtain a certain intermediate voltage distribution while performing a verify operation on the memory cell using a first verify voltage;
   a second write operation that performs a write on the memory cell having the intermediate voltage distribution after the first write operation to obtain a final voltage distribution corresponding to write data to the memory cell while performing a verify operation on the memory cell using a second verify voltage; and
   a change operation that changes a value of the first verify voltage according to the number of times of writes and the number of times of erases on the memory cell.

2. The semiconductor memory device according to claim 1, wherein
   the control circuit, before the first write operation, performs on the memory cell having an initial voltage distribution in an erase state a pre-write operation that performs a write at a voltage which is lower than a write voltage used during the first write operation and a pre-verify operation that determines whether the memory cell exceeds certain threshold voltage by the pre-write operation or not, and obtains the number of times of writes and the number of times of erases on the memory cell based on a result of the pre-verify operation.

3. The semiconductor memory device according to claim 1, wherein
   the control circuit obtains the number of times of writes and the number of times of erases on the memory cell by a counter that counts the number of times of writes and the number of times of erases on the memory cell.

4. The semiconductor memory device according to claim 1, wherein
   the control circuit is formed in an identical semiconductor chip to the memory cell.

5. The semiconductor memory device according to claim 1, wherein
   the control circuit is provided externally to a semiconductor chip where the memory cell is formed.

6. The semiconductor memory device according to claim 1, comprising a NAND cell unit including a plurality of the memory cells connected in series therein,
   wherein one end of the NAND cell unit is connected to a bit line via one select transistor, and the other end of the NAND cell unit is connected to a source line via another select transistor.

7. The semiconductor memory device according to claim 6, wherein
   the control circuit, before the first write operation, performs on the memory cell having an initial voltage distribution in an erase state a pre-write operation that performs a write at a voltage which is lower than a write voltage used during the first write operation and a pre-verify operation that determines whether the memory cell exceeds certain threshold voltage by the pre-write operation or not, and obtains the number of times of writes and the number of times of erases on the memory cell based on a result of the pre-verify operation.

8. The semiconductor memory device according to claim 6, wherein
   the control circuit obtains the number of times of writes and the number of times of erases on the memory cell by a counter that counts the number of times of writes and the number of times of erases on the memory cell.

9. The semiconductor memory device according to claim 1, wherein
   the memory cell is a memory cell capable of eight-level storage.

10. A method of controlling a semiconductor memory device, the semiconductor memory device comprising a nonvolatile memory cell capable of multi-level storage and a control circuit that performs write control on the memory cell, the method comprising the steps of:
    performing a first write that performs a write on the memory cell to obtain a certain intermediate voltage distribution while performing a verify operation on the memory cell using a first verify voltage;
    performing a second write that performs a write on the memory cell having the intermediate voltage distribution after the first write to obtain a final voltage distribution corresponding to write data to the memory cell while performing a verify operation on the memory cell using a second verify voltage; and
    changing a value of the first verify voltage according to the number of times of writes and the number of times of erases on the memory cell.

11. The method of controlling a semiconductor memory device according to claim 10, wherein
    before the first write operation, a pre-write operation that performs a write at a voltage which is lower than a write voltage used during the first write operation and a pre-verify operation that determines whether the memory cell exceeds certain threshold voltage by the pre-write operation or not are performed on the memory cell having an initial voltage distribution in an erase state, and the number of times of writes and the number of times of erases on the memory cell is obtained based on a result of the pre-verify.

12. The method of controlling a semiconductor memory device according to claim 10, wherein
    the number of times of writes and the number of times of erases on the memory cell is obtained by counting the number of times of writes and the number of times of erases on the memory cell.

13. The method of controlling a semiconductor memory device according to claim 11, wherein
    the semiconductor memory device comprises a NAND cell unit configured having a plurality of the memory cells connected in series therein, and
    one end of the NAND cell unit is connected to a bit line via one select transistor, and the other end of the NAND cell unit is connected to a source line via another select transistor.

14. The method of controlling a semiconductor memory device according to claim 13, wherein
    before the first write operation, a pre-write operation that performs a write at a voltage which is lower than a write voltage used during the first write operation and a pre-verify operation that determines whether the memory cell exceeds certain threshold voltage by the pre-write operation or not are performed on the memory cell having an initial voltage distribution in an erase state, and the number of times of writes and the number of times of erases on the memory cell is obtained based on a result of the pre-verify.

15. The method of controlling a semiconductor memory device according to claim 13, wherein the number of times of writes and the number of times of erases on the memory cell is obtained by counting the number of times of writes and the number of times of erases on the memory cell.

* * * * *